(12) United States Patent
Todorov et al.

(10) Patent No.: US 11,832,534 B2
(45) Date of Patent: Nov. 28, 2023

(54) THREE-TERMINAL OXYGEN INTERCALATION NEUROMORPHIC DEVICES

(71) Applicant: INTERNATIONAL BUSINESS MACHINES CORPORATION, Armonk, NY (US)

(72) Inventors: Teodor K Todorov, Yorktown Heights, NY (US); Douglas M. Bishop, New York, NY (US); Jianshi Tang, Elmsford, NY (US); John Rozen, Hastings on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 554 days.

(21) Appl. No.: 17/132,703

(22) Filed: Dec. 23, 2020

(65) Prior Publication Data

US 2021/0151669 A1    May 20, 2021

Related U.S. Application Data

(62) Division of application No. 16/157,484, filed on Oct. 11, 2018, now Pat. No. 10,930,844.

(51) Int. Cl.
| | |
|---|---|
| *H10N 70/20* | (2023.01) |
| *G06N 3/04* | (2023.01) |
| *G06N 3/063* | (2023.01) |
| *H01L 21/02* | (2006.01) |
| *H10N 70/00* | (2023.01) |

(52) U.S. Cl.
CPC ............... *H10N 70/24* (2023.02); *G06N 3/04* (2013.01); *G06N 3/063* (2013.01); *H01L 21/02104* (2013.01); *H10N 70/026* (2023.02); *H10N 70/253* (2023.02); *H10N 70/8833* (2023.02)

(58) Field of Classification Search
CPC .... H10N 70/24; H10N 70/026; H10N 70/253; H10N 70/8833; H01L 21/02104
See application file for complete search history.

(56) References Cited

U.S. PATENT DOCUMENTS

| | | |
|---|---|---|
| 6,815,744 B1 | 11/2004 | Beck et al. |
| 11,586,899 B2 * | 2/2023 | Todorov .................. G06N 3/08 |
| 2013/0079230 A1 | 3/2013 | Poppe et al. |
| 2016/0118680 A1 | 4/2016 | Haydn et al. |
| 2016/0248006 A1 | 8/2016 | Shi et al. |

(Continued)

OTHER PUBLICATIONS

C.B. Alcock et al., New electrochemical sensors for oxygen determination, Solid State Ionics, Aug. 1992, pp. 39-43.

(Continued)

*Primary Examiner* — Samuel A Gebremariam
(74) *Attorney, Agent, or Firm* — Tutunjian & Bitetto, P.C.; Robert Richard Aragona

(57) ABSTRACT

Methods of forming variable-resistance devices include forming a variable-resistance layer between a first terminal and a second terminal from a material that varies in resistance based on an oxygen concentration. An electrolyte layer is formed over the variable-resistance layer from a material that is stable at room temperature and that conducts oxygen ions in accordance with an applied voltage. A conductive gate layer is formed over the electrolyte layer.

16 Claims, 4 Drawing Sheets

(56) References Cited

U.S. PATENT DOCUMENTS

2017/0148982 A1     5/2017   Karpov et al.
2017/0358742 A1    12/2017   Govoreanu

OTHER PUBLICATIONS

Masaki Ando et al., Oxide Ion Conductivity and Chemical Stability of Lanthanum Fluorides Doped with Oxygen,La (Sr,Na)F3-2XOX, Chem. Mater., Sep. 2004, 16 (21), pp. 4109-4115.
Elliot J. Fuller et al., Li-Ion Synaptic Transistor for Low Power Analog Computing, Advanced Science News, Adv. Materials, Nov. 2016.
Kallarackel T. Jacob et al., Lanthanum Oxyfluoride: Structure, Stability, and Ionic Conductivity, Int. J. Appl. Ceram. Technol., Jul. 2006, pp. 312-321.
S. Selvasekarapandian et al., Ion conduction studies on LaF3 thin film by impedance spectroscopy, Physica B 337, May 2003, 52-57.
List of IBM Patents or Patent Applications Treated as Related dated Dec. 23, 2020, 2 pages.

\* cited by examiner

THREE-TERMINAL OXYGEN INTERCALATION NEUROMORPHIC DEVICES

BACKGROUND

Technical Field

The present invention generally relates to devices having settable resistances and, more particularly, to neuromorphic devices that use a room-temperature, solid electrolyte to mediate the transfer of oxygen ions for resistivity control.

Description of the Related Art

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There may be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

SUMMARY

A variable-resistance device includes a variable-resistance layer, formed between a first terminal and a second terminal, that varies in resistance based on an oxygen concentration in the variable-resistance layer. An electrolyte layer that is stable at room temperature and that conducts oxygen ions in accordance with an applied voltage is positioned over the variable-resistance layer. A gate layer is configured to apply a voltage on the electrolyte layer and the variable-resistance layer and is positioned over the electrolyte layer.

A variable-resistance device includes a variable-resistance layer, formed between a first terminal and a second terminal, that varies in resistance based on an oxygen concentration in the variable-resistance layer and that is formed from a material selected from the group consisting of tungsten trioxide and titanium dioxide. An electrolyte layer is formed over the variable-resistance layer and is formed from lanthanum trifluoride. An oxygen reservoir layer is formed over the electrolyte layer from cerium oxide and emits oxygen ions under the applied voltage. A conductive gate layer is formed on the oxygen reservoir layer and is configured to apply a voltage on the electrolyte layer and the variable-resistance layer.

A method of forming a variable-resistance device includes forming a variable-resistance layer between a first terminal and a second terminal from a material that varies in resistance based on an oxygen concentration. An electrolyte layer is formed over the variable-resistance layer from a material that is stable at room temperature and that conducts oxygen ions in accordance with an applied voltage. A conductive gate layer is formed over the electrolyte layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention implement the weights between neurons in a neural network using neuromorphic devices that have settable resistances. The use of lithium ions to set the resistance of a device presents certain challenges, because lithium compounds are often both water- and air-sensitive and are not readily compatible with existing microfabrication processes.

Embodiments described herein therefore use a material that exhibits resistivity change as a function of a concentration of, e.g., oxygen. While oxygen concentration can effectively tune the resistivity of many different oxide materials, it is difficult to obtain a solid, oxygen-conductive electrolyte, because most such electrolytes take the form of oxides themselves and present variable electric conductivity themselves as oxygen concentrations fluctuate. Some embodiments of the present invention use lanthanum trifluoride as a solid electrolyte later, which provides room-temperature conduction of oxygen ions or ionic exchange at the interfaces mediated by fluorine ion transport.

The present embodiments thereby provide a three-terminal neuromorphic device that has a settable resistivity and operates at room temperature. Source and drain terminals provide a resistive path between neurons of a neural network, while a voltage on a gate terminal controls the concentration of oxygen between the source and drain terminals, thereby controlling the resistance between the source and drain terminals.

Figure 1:
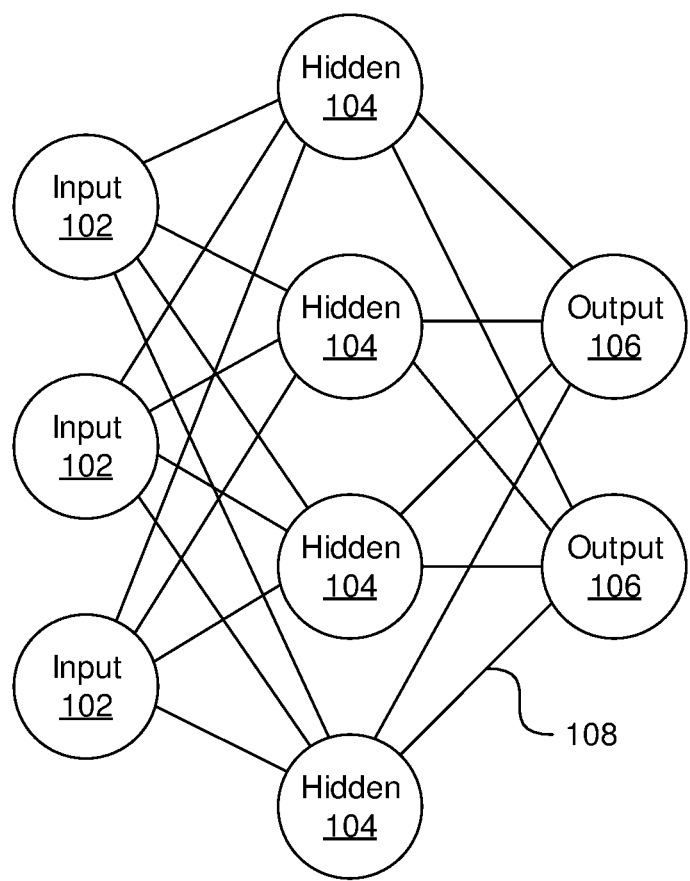
FIG. 1 is a prior art diagram of a generic artificial neural network that illustrates input neurons, a single layer of hidden neurons, and output neurons.
Figure 2:
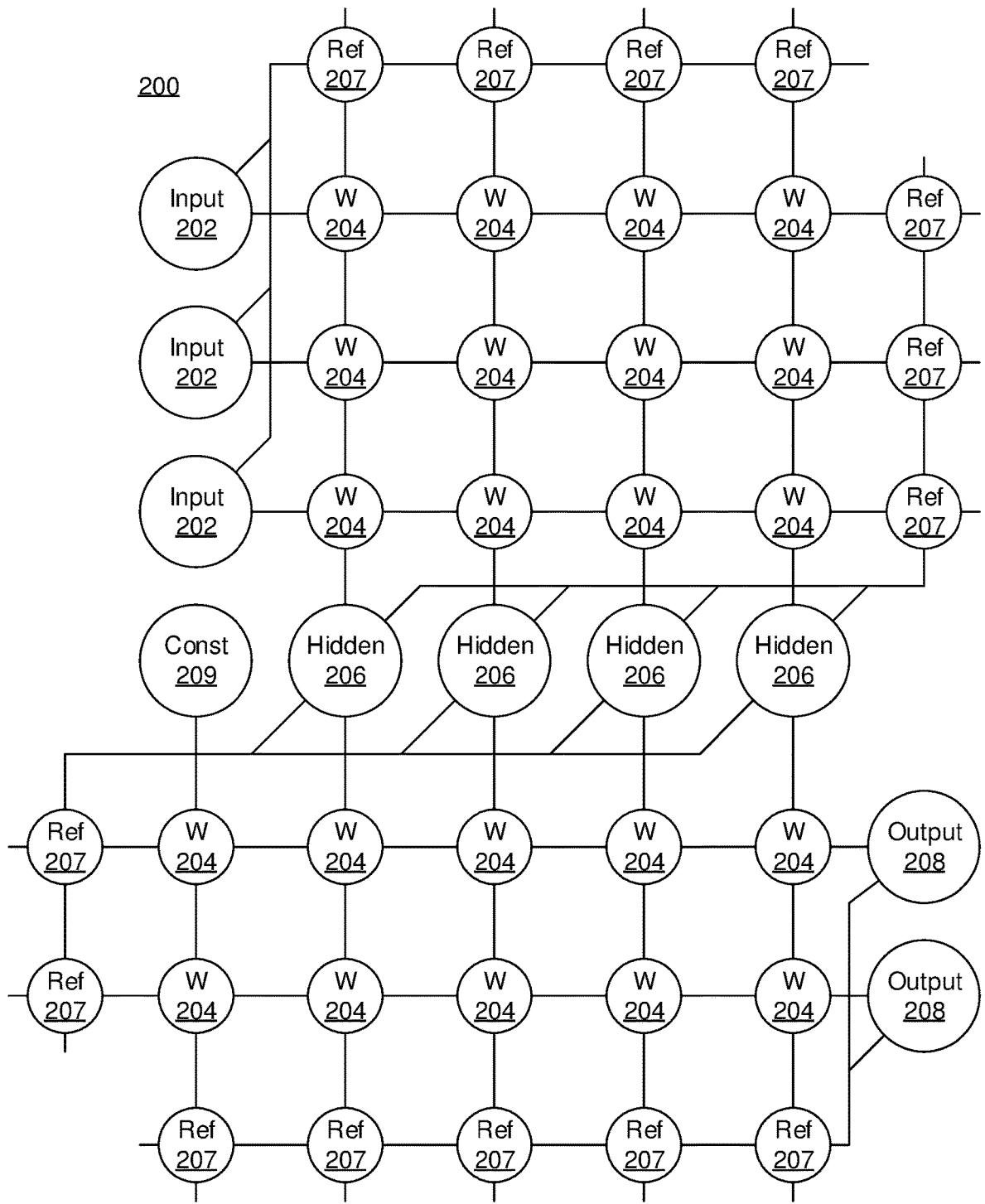
FIG. 2 is a diagram of an artificial neural network that illustrates weights and interconnections between neurons in respective layers in accordance with an embodiment of the present invention.

Referring now to the drawings in which like numerals represent the same or similar elements and initially to FIG. 2, an exemplary artificial neural network (ANN) architecture 200 is shown. It should be understood that the present architecture is purely exemplary and that other architectures or types of neural network may be used instead. During feed-forward operation, a set of input neurons 202 each provide an input voltage in parallel to a respective row of weights 204. The weights 204 each have a settable resistance value, such that a current output flows from the weight 204 to a respective hidden neuron 206 to represent the weighted input. The current output by a given weight is determined as $$I = \frac{V}{r},$$

where V is the input voltage from the input neuron 202 and r is the set resistance of the weight 204. The current from each weight adds column-wise and flows to a hidden neuron 206. A set of reference weights 207 have a fixed resistance and combine their outputs into a reference current that is provided to each of the hidden neurons 206. Because conductance values can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values.

As an alternative to using the reference weights 207, another embodiment may use separate arrays of weights 204 to capture negative values. Each approach has advantages and disadvantages. Using the reference weights 207 is more efficient in chip area, but reference values need to be matched closely to one another. In contrast, the use of a separate array for negative values does not involve close matching as each value has a pair of weights to compare against. However, the negative weight matrix approach uses roughly twice the chip area as compared to the single reference weight column. In addition, the reference weight column generates a current that needs to be copied to each neuron for comparison, whereas a negative matrix array provides a reference value directly for each neuron. In the negative array embodiment, the weights 204 of both positive and negative arrays are updated, but this also increases signal-to-noise ratio as each weight value is a difference of two conductance values. The two embodiments provide identical functionality in encoding a negative value and those having ordinary skill in the art will be able to choose a suitable embodiment for the application at hand.

The hidden neurons 206 use the currents from the array of weights 204 and the reference weights 207 to perform some calculation. The hidden neurons 206 then output a voltage of their own to another array of weights 204. This array performs in the same way, with a column of weights 204 receiving a voltage from their respective hidden neuron 206 to produce a weighted current output that adds row-wise and is provided to the output neuron 208.

It should be understood that any number of these stages may be implemented, by interposing additional layers of arrays and hidden neurons 206. It should also be noted that some neurons may be constant neurons 209, which provide a constant voltage to the array. The constant neurons 209 can be present among the input neurons 202 and/or hidden neurons 206 and are only used during feed-forward operation.

During weight updates, a control voltage at each weight 204 adjusts the resistance of each weight 204. The generated network response is compared to training data and an error is computed. The resistance values of the weights 204 are then adjusted in accordance with the computed error, with the new resistance values being adjusted by a third terminal on each weight 204.

According to the present embodiments, the weights 204 can be implemented as discrete hardware components in the form of neuromorphic devices having settable resistances. Such devices may have switching characteristics that have a non-linearity that can be used for processing data. The weights 204 may belong to a class of device called a resistive processing unit (RPU), because their non-linear characteristics are used to perform calculations in the neural network 200.

Figure 3:
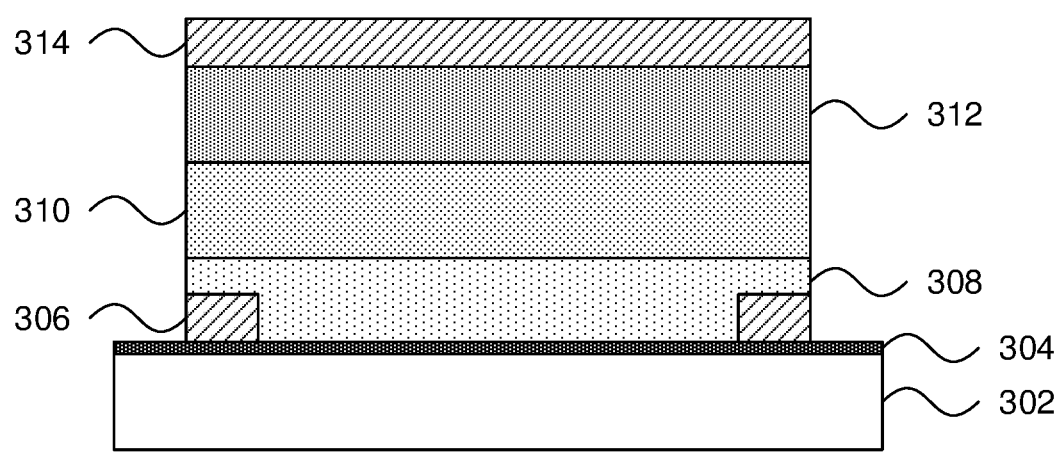
FIG. 3 is a cross-sectional diagram of a variable-resistance device that uses oxygen ion flow to control resistivity and that can be used as a weight in artificial neural networks in accordance with an embodiment of the present invention.

Referring now to FIG. 3, an exemplary neuromorphic device is shown that is suitable for use as a weight 204 in an ANN. A substrate 302 is shown and is particularly contemplated as being formed from a semiconductor material, though it should be understood that other materials may be used instead.

The substrate 302 may be a bulk-semiconductor substrate. In one example, a bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the substrate 302 may also be a semiconductor on insulator (SOI) substrate. Other exemplary substrate materials include glass, sapphire, diamond, metals, ceramics, and polymers. Such polymers may include, for example, polyimide or polymethylmethacrylate (PMMA).

An insulator layer 304 is formed on the substrate 302, particularly in embodiments whether the substrate 302 is formed from a semiconductor or conductive material. It is specifically contemplated that the insulator layer 304 may be formed from silicon nitride, but it should be understood that any appropriate insulator material may be formed by any appropriate process to form the insulator layer 304.

Source and drain structures 306 are formed on the insulator by any appropriate process. It is specifically contemplated that the source and drain structures may be formed from, e.g., titanium at a thickness of about 5 nm or platinum at a thickness of about 50 nm, but it should be understood that any appropriate material and thickness may be used, including for example tungsten, nickel, molybdenum, tantalum, copper, silver, gold, ruthenium, iridium, rhenium, rhodium, and alloys thereof. It is specifically contemplated that the source and drain structures 306 may be formed by an appropriate physical vapor deposition (PVD) process, whereby a sputtering apparatus may include electron-beam evaporation, thermal evaporation, direct-current diode systems, radio frequency sputtering, magnetron sputtering, or ionized metal plasma sputtering. The deposited layer may be etched to form the source and drain structures 306 by any appropriate photolithographic process.

A variable-resistance layer 308 is then formed over and between the source and drain structures 306. It is specifically contemplated that the variable-resistance layer 308 is formed from an oxide material, such as tungsten trioxide or titanium dioxide, which has a resistance that changes based on a concentration of oxygen within the variable-resistance layer 308. The variable-resistance layer 308 may be formed by any appropriate deposition process. It is specifically contemplated that a tungsten trioxide layer about 50 nm thick may be formed by sputtering and that a titanium dioxide layer about 40 nm thick may be formed by electron beam evaporation.

It is specifically contemplated that the variable-resistance layer 308 accepts additional oxygen ions by intercalation, where the oxide material creates a crystalline structure and additional oxygen ions (e.g., $O^{2-}$) fit into gaps in that crystalline structure under an appropriate voltage. The voltage overcomes the repulsive force created by any electrical charge already present in the variable-resistance layer 308, forcing more charged ions to occupy that layer.

An electrolyte layer 310 is formed on the variable-resistance layer 308. It is specifically contemplated that the electrolyte layer 310 is formed from lanthanum trifluoride at a thickness of about 80 nm by a thermal evaporation process. It should be noted that lanthanum trifluoride is stable at room temperature and is conductive to oxygen ions, permitting the transfer of oxygen ions to and from the variable-resistance layer 308. Lanthanum fluoride can contain substantial oxygen impurities distributed throughout the layer or segregated at its interfaces. At room temperature, the majority of the ionic transport is mediated by fluorine mobility across the layer, whereas oxygen exchange with the neighboring layers occurs mostly at the interfaces. In some embodiments, the electrolyte layer 310 may be formed from a doped lanthanum trifluoride. Exemplary dopants include, for example, oxygen, nitrogen, chlorine, bromine, iodine, calcium, strontium, barium, yttrium, and zirconium. The dopant may have an exemplary atomic concentration within the electrolyte layer 310 between about 0.001% to about 20%.

An optional oxygen reservoir layer 312 may be formed on the electrolyte layer 310. It is specifically contemplated that the oxygen reservoir layer 312 may be formed from any appropriate oxygen-containing material where oxygen ions readily dissociate under an applied voltage. One exemplary material for the oxygen reservoir layer 312 is cerium oxide, which reversibly converts to a nonstoichiometric oxide by emitting oxygen ions when subjected to an appropriate voltage. In one specific example, the oxygen reservoir layer 312 may be formed from cerium oxide at a thickness of about 50 nm by a thermal evaporation process. Other oxides capable of oxygen exchange include tungsten oxides, titanium oxides, cupric oxides, and gaseous/atmospheric oxygen and may be used as an oxygen reservoir. Thus, a distinct oxygen reservoir may, in some embodiments, be omitted in favor of using atmospheric oxygen.

A gate electrode 314 is formed on the oxygen reservoir layer 312, if such a reservoir layer is present. If not, then the gate electrode 314 is formed on the electrolyte layer 310. The gate 314 applies a voltage across the device that forces oxygen ions into the variable-resistance layer 308. It is specifically contemplated that the gate may be formed from, e.g., titanium at a thickness between about 1 nm and about 1000 nm, with a thickness of about 2 nm being specifically contemplated, or platinum at a thickness between about 1 nm and about 2000 nm, with a thickness of about 30 nm being specifically contemplated, though it should be understood that any appropriate conductive material may be formed at any appropriate thickness between about 2 nm to about 2000 nm by any appropriate process. The device provides a symmetric response to voltages applied to the gate electrode 314, where a positive voltage pulse will cause a resistance change having a similar magnitude to, and opposite direction from, the resistance change caused by a negative voltage pulse.

In some embodiments, the gate electrode 314 may be porous. This is particularly contemplated for embodiments that lack an oxygen reservoir 312, allowing atmospheric oxygen to penetrate the electrode 314 to reach the electrolyte 310. The pores can be any appropriate size and shape that allows oxygen to freely flow to and from the electrolyte 310.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower" "above," "upper," and the like, can be used herein for ease of description to describe one element's or feature's relationship to another element(s) or feature(s) ac illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 4:
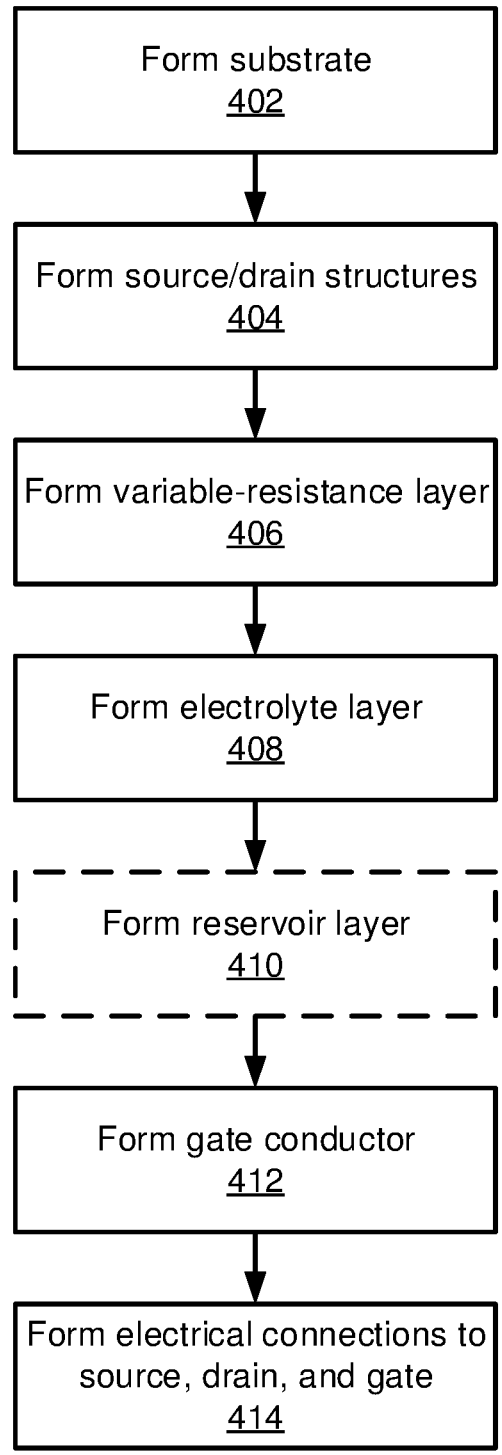
FIG. 4 is a block/diagram of a method of forming a variable-resistance device that uses oxygen ion flow to control resistivity and that can be used as a weight in artificial neural networks in accordance with an embodiment of the present invention.

Referring now to FIG. 4, a process of fabricating a variable-resistance neuromorphic device is shown. Block 402 forms a substrate 302. As noted above, the substrate 302 can be formed from any appropriate material and may come in the form of a standard semiconductor wafer. Thus, forming the substrate in block 402 may include, for example, forming a semiconductor wafer from scratch with the insulator coating 304, or may include purchasing a semiconductor wafer and applying the insulator coating 304. Other options include the formation of non-semiconductor substrates, including insulating or conductive substrates, with or without the insulator layer 304.

Block 404 forms source and drain structures 306. A conductor layer formed from, e.g., titanium, platinum, or any other appropriate conductor may be deposited using any appropriate deposition process, with electron beam evaporation being specifically contemplated. The conductor layer may then be photolithographically etched to create the source and drain structures 306.

Block 406 forms the variable-resistance layer 308. This layer may be formed from any appropriate material that intercalates oxygen ions and changes its resistance according to the intercalated oxygen ion concentration. Exemplary materials include tungsten trioxide and titanium dioxide, but it should be understood that other materials may be used as well.

Block 408 forms the electrolyte layer 310 on the variable resistance layer 308. The electrolyte later 308 is contemplated as being a material that is solid and stable at room temperature and provides conduction of oxygen ions. It is specifically contemplated that the electrolyte layer 308 may be formed from lanthanum trifluoride by a thermal evaporation process.

Block 410 optionally forms reservoir layer 312 on the electrolyte layer 310. The reservoir layer 312 holds oxygen ions that can be readily dislodged into the electrolyte layer 310. Thus, any appropriate oxygen-containing material that will emit oxygen ions under a voltage will be appropriate for this layer, though cerium oxide is specifically contemplated. The reservoir layer 312 may be formed using any appropriate deposition process, such as a thermal evaporation process.

Block 412 forms a gate conductor 314 over the electrolyte layer 310 and over the reservoir layer 312, if one is used. The gate conductor 314 may be formed from any appropriate conductive material, such as titanium or platinum, and may be formed by any appropriate deposition process. Block 414 then forms electrical connections to the source and drain structures 306 and to the gate conductor 314. Additional processing steps may be performed, including etching the entire stack to separate neighboring devices from one another, depositing a passivating layer over and around the device(s), and forming vias through the passivating layer to provide electrical access to the source and drain structures 306 and to the gate 314.

Having described preferred embodiments of three-terminal oxygen intercalation neuromorphic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a variable-resistance device, comprising: forming a variable-resistance layer between a first terminal and a second terminal from a material that varies in resistance based on an oxygen concentration; forming an electrolyte layer over the variable-resistance layer from a material that is stable at room temperature and that conducts oxygen ions in accordance with an applied voltage; and forming a conductive gate layer directly on the electrolyte layer.

2. The method of claim 1, wherein the electrolyte layer is formed from lanthanum trifluoride.

3. The method of claim 1, wherein the variable-resistance layer is formed from a material that intercalates oxygen under the applied voltage.

4. The method of claim 3, wherein the variable-resistance layer is formed from a material selected from the group consisting of tungsten trioxide and titanium dioxide.

5. The method of claim 1, further comprising forming an oxygen reservoir layer before forming the conductive gate layer from a material that emits oxygen ions under an applied voltage.

6. The method of claim 5, wherein the oxygen reservoir layer is formed from cerium oxide.

7. The method of claim 1, wherein forming the variable-resistance layer comprises forming the variable-resistance layer on an insulator-coated substrate.

8. The method of claim 1, wherein the first terminal and the second terminal are formed from a conductive metal.

9. The method of claim 1, wherein the conductive gate layer is made porous to expose the electrolyte layer.

10. A method of forming a variable-resistance device, comprising:
    forming a variable-resistance layer from a material that varies in resistance based on an oxygen concentration, on an in substrate, between a first terminal and a second terminal;
    forming an electrolyte layer over the variable-resistance layer from a material that is stable at room temperature and that conducts oxygen ions in accordance, with an applied voltage;
    forming an oxygen reservoir layer from a material that emits oxygen ions under an applied voltage; and
    forming a conductive gate layer over the oxygen reservoir layer.

11. The method of claim 10, wherein the electrolyte layer is formed from lanthanum trifluoride.

12. The method of claim 10, wherein the variable-resistance layer is formed from a material that intercalates oxygen under the applied voltage.

13. The method of claim 12, wherein the variable resistance layer is formed from a material selected from the group consisting of tungsten trioxide and titanium dioxide.

14. The method of claim 10, wherein the oxygen reservoir layer is formed from cerium oxide.

15. The method of claim 10, wherein the first terminal and the second terminal are formed from a conductive metal.

16. A method of forming a variable-resistance device, comprising:
    forming a variable-resistance layer from a material selected from the group consisting of tungsten trioxide, and titanium dioxide, on an insulator-coated substrate, between a first conductive metal terminal and a second conductive metal terminal;
    forming an electrolyte layer over the variable-resistance layer from lanthanum trifluoride;
    forming an oxygen reservoir layer from cerium; and
    forming a conductive gate layer over the oxygen reservoir layer.

* * * * *